United States Patent [19]

Yaba et al.

[11] Patent Number: 4,808,462
[45] Date of Patent: Feb. 28, 1989

[54] SOLAR CELL SUBSTRATE

[75] Inventors: Susumu Yaba, Yokohama, Japan; Christopher M. Walker, Boulder, Colo.; Stephen Muhl, Lakewood, Colo.; Arun Madan, Golden, Colo.

[73] Assignee: Glasstech Solar, Inc., Colo.

[21] Appl. No.: 52,991

[22] Filed: May 22, 1987

[51] Int. Cl.$^4$ .................. B32B 17/06; H01L 31/04
[52] U.S. Cl. .................. 428/142; 428/174; 428/432; 136/256; 136/258
[58] Field of Search .................. 428/142, 174, 432; 136/256, 258 AM

[56] References Cited

U.S. PATENT DOCUMENTS

| 4,497,974 | 2/1985 | Deckman et al. | 136/259 |
| 4,500,743 | 2/1985 | Hayashi et al. | 136/258 |
| 4,532,537 | 7/1985 | Kane | 357/30 |
| 4,554,727 | 11/1985 | Deckman et al. | 29/572 |
| 4,599,482 | 7/1986 | Yamazaki | 136/259 |
| 4,683,160 | 7/1987 | Bloch et al. | 428/141 |
| 4,689,438 | 8/1987 | Fukatsu et al. | 136/256 |
| 4,694,116 | 9/1987 | Hayashi et al. | 136/256 |
| 4,732,621 | 3/1988 | Murata et al. | 136/256 |
| 4,746,372 | 5/1988 | Tajika et al. | 136/258 |

OTHER PUBLICATIONS

H. Iida et al., High Efficiency a-Si:H p-i-n Solar Cell Using a SnO$_2$/Glass Substrate, May 1982, pp. 114–115, IEEE Electron Device Letters, vol. EDL-3.

Carlson et al., Properties of Amorphous Silicon and a-Si Solar Cells, Jun. 1977, pp. 211–225, RCA Review, vol. 38.

D. Carlson, Amorphous Silicon Solar Cells, Apr., 1977, pp. 449–453, IEEE Trans. Electron Devices, vol. ED-24.

H. Takakura, Low-Cost High-Efficiency SnO$_2$/n$^+$-p S1 Heteroface Solar Cell Fabricated by Paint-On-Difusant Method, May, 1980, pp. 1186–1191, 14th IEEE Photovoltaic Specialists Conf.

P. A. Iles, Design Factors for Transparent Conducting Layers in Solar Cells, Nov., 1976, pp. 978–988, 12th IEEE Photovoltaic Specialists Conf.

H. Iida et al., Efficiency of the a-Si:H Solar Cell and Grain Size of SnO$_2$ Transparent Conductive Film, May, 1983, pp. 157–159, IEEE Electron Device Letters, vol. EDL-4.

E. Yablonovitch et al., Intensity Enhancement in Textured Optical Sheets for Solar Cells, Feb., 1982, pp. 300–305, IEEE Trans on Electron Devices, vol. ED-29.

H. Deckman et al., Optical Enhancement of a-SiH$_x$ Solar Cells, 16th IEEE Photovoltaic Specialists Conf. (1982), pp. 1425–1426.

H. Iida et al., Optical Confinement Type A-Si:H Solar Cell Using Milky Tin Oxide on Glass, May, 1984, pp. 717–719, IEEE Trans. on Electron Devices, vol. ED-31.

H. Iida et al., The Structure of Natively Textured SnO$_2$ Film and its Application to an Optical Confinement-Type A-Si:H Solar Cell, Feb., 1987, pp. 271–276, IEEE Trans. on Electron Devices, vol. ED-34.

A. Greenwald et al., *Conference Record, 19th IEEE Photovoltaic Specialists Conference* (1987), pp. 621–625.

Primary Examiner—Aaron Weisstuch
Attorney, Agent, or Firm—Brooks & Kushman

[57] ABSTRACT

A solar cell substrate comprising a glass substrate and a transparent electrically conductive layer formed thereon, said conductive layer having a plurality of polygonal projections, having approximate diameters of from 0.1 to 0.3 μm and height/diameter ratios of at least 0.6

5 Claims, 1 Drawing Sheet

U.S. Patent     Feb. 28, 1989     4,808,462
FIG. 1
PRIOR ART
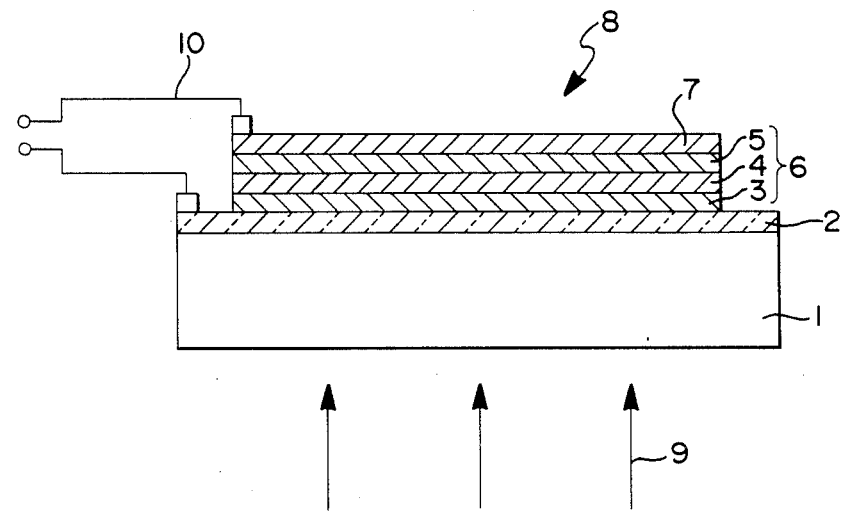
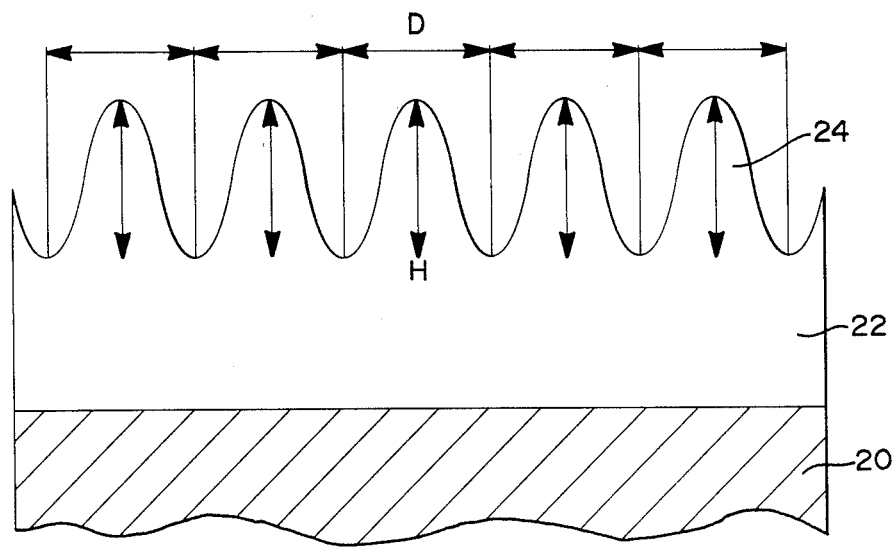
FIG. 2

SOLAR CELL SUBSTRATE

TECHNICAL FIELD

The present invention relates to a solar cell substrate useful in the production of amorphous silicon solar cells.

BACKGROUND ART

As shown in FIG. 1, a prior art amorphous silicon solar cell is illustrated generally as 8 and comprises a transparent insulating substrate 1, a transparent electrically conductive layer 2 and a semiconductor photoelectric conversion laminate 6 composed of a p-type amorphous silicon layer 3, an i-type amorphous silicon layer 4, an n-type amorphous silicon layer 5, and an aluminum electrode 7 acting as the back contact. This configuration is practically used as a photoelectric conversion device capable of being produced at a relatively low cost. Such an amorphous solar cell 8 is designed so that light enters the solar cell through the transparent insulating substrate 1 and is absorbed mainly by the i-type amorphous silicon layer 4. An electromotive force is generated between the two electrodes, the transparent electrically conductive layer 2 and the aluminum electrode 7, and electricity is led out of the solar cell by a conductor 10.

For such an amorphous silicon solar cell, it is most important to improve the photoelectric conversion efficiency. As a method of achieving this, it is known to roughen the surface of the transparent electrically conductive layer. By roughening the surface, incident light is scattered at the interface between the transparent electrically conductive layer and the amorphous silicon semiconductor layer. The effect of this optical scattering is to reduce the surface reflection loss of the incident light and to increase the absorbance in the i-type amorphous silicon layer. As a result of multiple reflection and refraction in the amorphous silicon semiconductor layer, the length of the optical path increases and the light-collecting efficiency of the amorphous silicon solar cell for long wavelength lights will be improved by the light-trapping effect in the i-type amorphous silicon layer. The short-circuit current density will also be increased, thereby improving the power generation efficiency and the photoelectric conversion efficiency.

As specific method for such surface roughening, Japanese unexamined patent publication No. 57756/1983 discloses an average particle size of the surface of the transparent electrically conductive layer from 0.1 to 22.5 $\mu$m; Japanese unexamined patent publication No. 201470/1984 discloses the preparation of a transparent electrically conductive layer composed of crystal grains having an average grain size of from 0.1 to 0.9 $\mu$m; Japanese unexamined patent publication No. 103384/1984 discloses an average grain size of fine crystals constituting a transparent electrically conductive layer to be at least 300 Å; and Japanese unexamined patent publication No. 175465/1985 discloses forming a silicon oxide coating layer having a haze of at least 1% and having a number of projections having a diameter of from 300 to 500 Å and a height of from 200 to 3,000 Å, to obtain a solar cell substrate having a transparent electrically conductive layer.

With solar cell substrates having the above-mentioned structures, it may be possible to increase the photoelectric conversion efficiency to some extent, but they are inadequate for the purpose of greatly improving the efficiency.

SUMMARY OF THE INVENTION

IT is an object of the present invention to provide a solar cell substrate coated with a transparent conductive oxide having an optimum textured surface whereby an improved photoelectric conversion efficiency can be obtained.

The present invention provides a solar cell substrate including a glass substrate and a transparent electrically conductive layer formed thereon. The transparent electrically conductive layer has a plurality of polygonal projections having diameters of from 0.1 to 0.3 $\mu$m and height/-diameter ratios of at least 0.6.

BRIEF DESCRIPTION OF THE DRAWINGS

FIG. 1 is a cross-sectional view of an amorphous silicon solar cell; and

FIG. 2 is a partial enlarged cross-sectional view illustrating the surface of the transparent electrically conductive layer of the solar cell substrate of the present invention.

BEST MODE FOR CARRYING OUT THE INVENTION

For the substrate to be used in the present invention, it is possible to employ a transparent glass sheet made of soda-lime silicate glass, aluminosilicate glass, borate glass, lithium aluminosilicate glass, quartz glass or various other glasses. It is desirable for the substrate to exhibit a high transmittance, e.g. transmittance of at least 80%, in a wavelength range of from 350 to 800 nm. It is also desirable to have good insulating properties, high chemical and physical durability and excellent optical properties. In the case of a substrate made of a glass containing sodium, such as soda-lime silicate glass, or a substrate made of a low alkali-containing glass, an alkali barrier coating, such as a silicon oxide, aluminum oxide or zirconium oxide layer, may be provided on the substrate in order to minimize diffusion of ions, including sodium, from the glass into the transparent electrically conductive layer formed thereon.

The transparent electrically conductive material formed on the glass substrate is preferably made of a transparent metal oxide having a desired conductivity, such as tin oxide doped with from 0.1 to 5% by weight of fluorine, tin oxide doped with from 0.1 to 30% by weight of antimony, or indium oxide doped with from 0.5 to 30% by weight of tin. Among those described, a transparent electrically conductive layer made of fluorine-doped tin oxide is most suitable for a solar cell substrate, since it is possible to readily obtain a sheet resistance lower than 30$\Omega$/□. The fluorine-doped tin oxide is resistant to chemical reduction caused by hydrogen plasma, to which it is exposed during the formation of amorphous silicon layers in a plasma enhanced chemical vapor deposition chamber.

Referring now to FIG. 2, the solar cell substrate shown has a transparent electrically conductive layer with a roughened texture over its entire surface. Namely, the transparent electrically conductive layer 22 has a plurality of projections 24, each having a diameter D of from 0.1 to 0.5 $\mu$m, a height H of from 0.1 to 0.6 $\mu$m, and a height/diameter ratio (H/D) of at least 0.6, preferably from 0.7 to 1.2. The height of such projections 24 is preferably less than 0.25 $\mu$m. The shape of the projections vary. In a typical example, the shape of the base portion of each projection is tetragonal or has a shape of a higher order polygon. Atmospheric pressure chemical vapor deposition automatically produces a textured oxide layer. The shape of the textured projections depend on the chemical composition of the layer.

In the present invention, projections having a diameter outside the range of from 0.1 to 0.5 μm or a height/diameter ratio outside the range of at least 0.6, may be present to some extent so long as more than 80% of the surface topography conforms to the preferred specifications.

The transparent electrically conductive layer should have a sheet resistance value less than 30Ω/□, preferably from 4 to 10Ω/□. This range is desirable particularly in view of securing a high transmittance and avoiding ohmic losses in a large area substrate. In the present invention, the haze is most preferably from 8 to 30% in view of the above-mentioned relationship between the particle shape and the optical properties.

The transparent electrically conductive layer of the present invention may be prepared by various conventional methods, such as chemical vapor deposition, pyrolytic spraying, sputtering, vacuum deposition, ion plating or dipping. Of these methods, chemical vapor deposition and sputtering are most preferred, since projections having the above-mentioned diameter, height and height-diameter ratio, can readily be obtained in a controlled manner.

Preparation of transparent electrically conductive layers may be accomplished by using $SnCl_4$, $H_2$, $CH_3OH$ and HF carried by nitrogen gas and diluted nitrogen gas, as reactive gases. The transparent electrically conductive layers are preferably prepared in a belt conveyor type atmospheric chemical vapor deposition furnace having a heating zone and a cooling zone. The heating zone has a nozzle for supplying the reactive gases.

The gas supply nozzle includes fine slit-form gas outlets and adapts to supply $SnCl_4$ and diluting nitrogen gas from a central slit. Nitrogen gas separates from the two slits adjacent thereto by separating lines, and $H_2O$, $CH_3OH$, HF and diluting nitrogen gas are supplied from outerlying slits. Furthermore, the distance between the glass substrate and the gas outlets would preferably be adjustable.

Texturing of a transparent conductive oxide layer is characterized by the interrelation of parameters of various features. These parameters are functions of the reactive gas composition, gas flow, substrate temperature, furnace belt speed and furnace design. Typical preferred ranges include the following:

| | |
|---|---|
| Substrate temperature | 550–650° C. |
| Furnace belt speed | 8–30 cm/min. |
| Gas flows | |
| —$SnCl_4$ | 0.1–1.0 l/min. |
| —$H_2O$ | 1.0–10.0 l/min. |
| —HF | 0.1–1.0 l/min. |
| —$CH_3OH$ | 0.1–1.0 l/min. |
| H/D ratio | 0.6 to 1.5 |

Samples manufactured under these conditions exhibit advantageous properties for use in the production of solar cells.

In the present invention, the incident light enters the solar cell through the interface of the transparent electrically conductive layer and the amorphous silicon layer and penetrates into the amorphous silicon layer. When the electrically conductive layer has a textured surface, the light is scattered by the textured surface and the scattered light is taken into the amorphous layer. The optical path in the silicon layer is elongated, and the absorption efficiency of light is thereby improved. This effect is particularly remarkable in a long wavelength range where the absorptive coefficient of silicon is small. In order to increase the scattering of light in this long wavelength range, certain levels of the height and the diameter of projections are required.

Accordingly, it is desirable for the ratio of the height to the diameter to be quite large. However, if the height is too great, it is difficult to uniformly deposit an amorphous silicon layer on the transparent electrically conductive layer. Therefore, the height is restricted by the thickness of the amorphous silicon layer or the ability of the amorphous silicon deposition system to conformally deposit layers while maintaining good electronic properties.

Solar cell performance including use of the substrate of the present invention provides the following advantages: (1) the short-circuit current density is improved by about 1 $mA/cm^2$; and (2) the photoelectric conversion efficiency is improved by about 0.5% absolute units.

While the best modes for carrying out the invention have herein been described in detail, those familiar with the art to which this invention relates will recognize various alternatives and embodiments for carrying out the invention as defined by the following claims.

What is claimed is:

1. A solar cell substrate, comprising a transparent glass substrate having at least one surface and an electrically conductive layer of a tranparent conductive material formed thereon by atmospheric pressure chemical vapor deposition, said conductive layer having a surface topography including a plurality of polygonal projections extending in a direction opposite said one surface of the substrate and said polygonal projections having diameters in the range from 0.1 to 0.3 μm and height/diameter ratios of at least 0.6 over more than eighty percent of the surface topography.

2. The solar cell substrate as in claim 1, wherein the height/diameter ratio of said polygonal projections is from 0.7 to 1.2.

3. The solar cell substrate as in claim 1, wherein said transparent conductive material is selected from a group consisting of tin oxide, fluorine doped tin oxide, antimony doped tin oxide, and indium doped tin oxide.

4. The solar cell substrate as in claim 1, wherein said electrically conductive layer has a sheet resistance of from 4 to 10Ω/□.

5. The solar cell substrate as in claim 1, wherein said electrically conductive layer has a haze from 8 to 30%.

* * * * *

UNITED STATES PATENT AND TRADEMARK OFFICE
CERTIFICATE OF CORRECTION

PATENT NO. : 4,808,462
DATED : February 28, 1989
INVENTOR(S) : SUSUMU YABA et al.

It is certified that error appears in the above-identified patent and that said Letters Patent is hereby corrected as shown below:

Column 1, Line 48,     "method" should be --methods--

Column 2, Line 15,     "height/-diameter" should be --height/diameter--;

Column 4, Claim 1, Line 41,     "tranparent" should be --transparent--.

Signed and Sealed this

Tenth Day of April, 1990

Attest:

HARRY F. MANBECK, JR.

*Attesting Officer*     *Commissioner of Patents and Trademarks*